United States Patent
Tsuji et al.

[11] Patent Number: 5,882,995
[45] Date of Patent: Mar. 16, 1999

[54] METHOD OF FORMING OHMIC ELECTRODES ON SEMICONDUCTOR WAFER

[75] Inventors: Hideyuki Tsuji, Nara; Toshiyuki Shinozaki, Tenri, both of Japan

[73] Assignee: Sharp Kabushiki Kaisha, Osaka, Japan

[21] Appl. No.: 748,624

[22] Filed: Nov. 13, 1996

[30] Foreign Application Priority Data

Mar. 26, 1996 [JP] Japan ............................ 8-70028

[51] Int. Cl.⁶ .................... H01L 21/441; H01L 21/265
[52] U.S. Cl. ................ 438/597; 438/577; 438/606; 438/670; 148/DIG. 50
[58] Field of Search .................... 438/584–597, 438/167–576, 577, 673, 634, 637, 642, 344

[56] References Cited

U.S. PATENT DOCUMENTS

| | | | |
|---|---|---|---|
| 4,731,340 | 3/1988 | Chang et al. | 438/670 |
| 4,824,800 | 4/1989 | Takano | 438/577 |
| 5,362,678 | 11/1994 | Komaru et al. | 438/606 |

FOREIGN PATENT DOCUMENTS 7-99773   5/1998   Japan .

OTHER PUBLICATIONS

Wolf, Silicon Processing for the VLSI ERA Lattice Press p. 84, 1990.

*Primary Examiner*—Charles Bowers
*Assistant Examiner*—David S. Blum
*Attorney, Agent, or Firm*—Nixon & Vanderhye PC

[57] ABSTRACT

In the case where ohmic electrodes are formed on a semiconductor wafer, first of all, an insulating layer is formed on the semiconductor wafer, then a resist layer is formed on the insulating layer. Next, apertures for forming electrodes are formed in first regions of the resist layer corresponding to regions where the electrodes are formed, while dummy apertures are also formed in a second region of the resist layer in a rest part other than the first regions. Thereafter, the insulating layer is etched using the resist layer as a mask. With the resist layer remaining, electrode material is accumulated on the surface of the semiconductor wafer, and thereafter, the resist layer is removed. As a result, electrodes with desirable ohmic characteristics are stably formed.

11 Claims, 4 Drawing Sheets

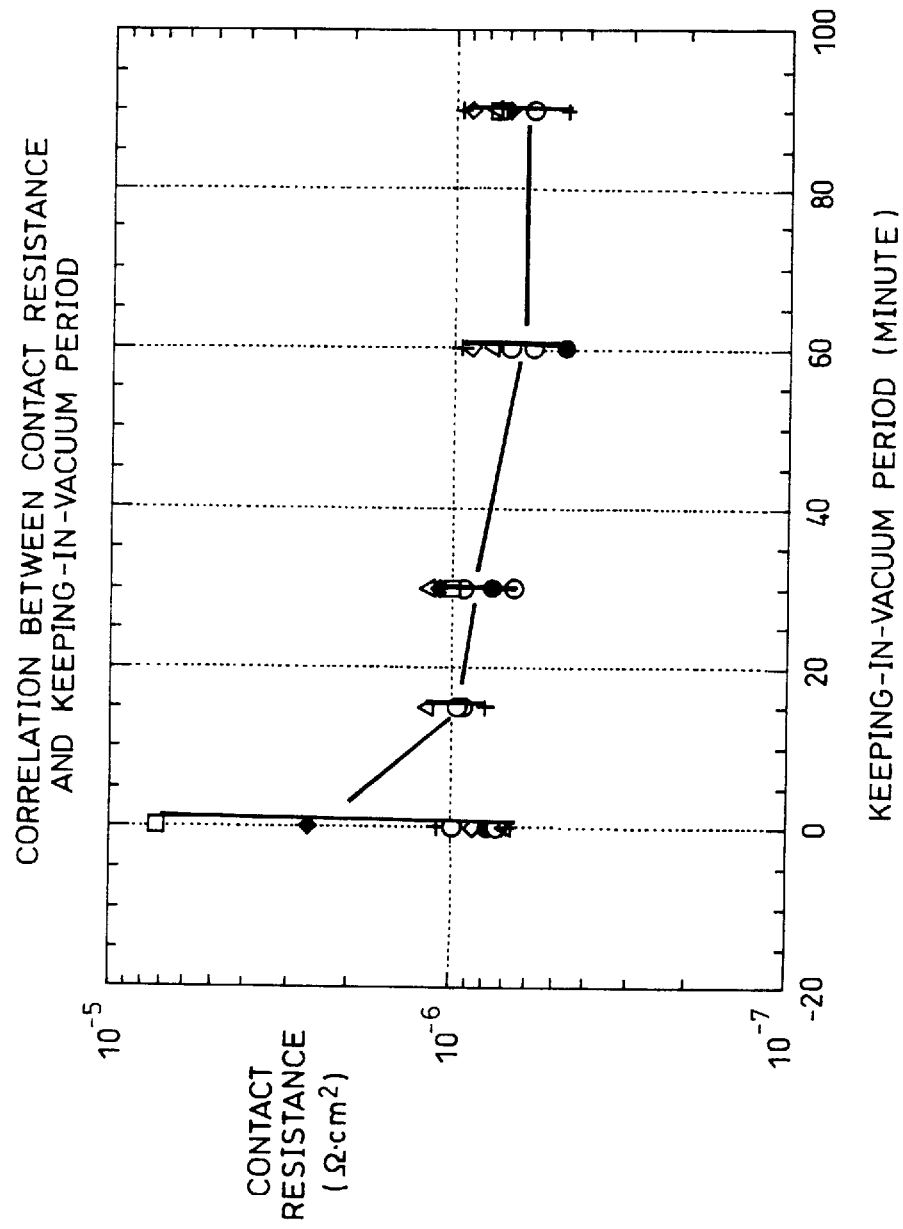

METHOD OF FORMING OHMIC ELECTRODES ON SEMICONDUCTOR WAFER

FIELD OF THE INVENTION

The present invention relates to a method of forming ohmic electrodes on a semiconductor wafer.

BACKGROUND OF THE INVENTION

In the case where a transistor is formed on a semiconductor wafer, electrodes of the transistor are formed on the wafer. In this case, each contact between the semiconductor wafer and each electrode is required to be an ohmic contact which has a small contact resistance. When, for example, a bipolar transistor is formed on a III–V compound semiconductor wafer using Ti/Pt/Au known as standard electrode material so as to form emitter electrodes or the like of the transistor, a problem described below arises. Since Ti in the electrode material is thermally unstable, it is difficult to form excellent ohmic electrodes on a region of the III–V compound semiconductor.

Therefore, conventionally used for forming ohmic electrodes on a III–V compound semiconductor wafer is thermally stable material with a high melting point, such as a metal nitride having a high melting point, or a metal silicide having a high melting point. Given as examples for the former are tungsten nitride (WN), molybdenum nitride (MoN), and titanium nitride (TiN). Given as examples for the latter are tungsten silicide (WSi), molybdenum silicide (MoSi), and titanium silicide (TiSi)

FIGS. 2(a) through 2(c) are process drawings illustrating a conventional method of forming electrodes. The conventional method of forming electrodes will be described below, with reference to these figures.

First of all, a resist layer 23 is formed on a III–V compound semiconductor wafer 21 having an insulating layer 22 on the surface (see FIG. 2(a)).

At the next stage, apertures 24 are formed at predetermined regions in the resist layer 23 which correspond to regions where electrodes are formed. Thereafter, etching is carried out to the insulating layer 22 utilizing the resist layer 23 as mask, so that a contact hole 25 is formed in the insulating layer 22 (see FIG. 2(b)).

Then, electrode material (for example, WN) is accumulated on the wafer 21, with the resist layer 23 unremoved. Thereafter, the resist layer 23 is removed, thereby completing formation of electrodes 26 at the predetermined regions (see FIG. (c)).

However, an ohmic contact failure sometimes occurs to the electrode 26 thus formed by the conventional method, which leads to an increase in a contact resistance (the contact resistance exceeds $1 \times 4^{-4}$ $\Omega.cm^2$, while a normal contact resistance is $3 \times 10^{-7}$ $\Omega.cm^2$). The ohmic failure causes a decrease in a yield of the semiconductors in the semiconductor manufacturing process.

SUMMARY OF THE INVENTION

The object of the present invention is to provide a method of forming ohmic electrodes on a semiconductor wafer, whereby electrodes having good ohmic characteristics are stably formed.

To achieve the above object, the method comprises the steps of:

(a) forming an insulating layer on the semiconductor wafer;

(b) forming a resist layer on the insulating layer;

(c) forming first apertures for forming the ohmic electrodes, each first aperture being formed in each first region of the resist layer corresponding to each region where each ohmic electrode is to be formed;

(d) forming second apertures as dummy apertures in a second region of the resist layer in a rest part other than the first regions;

(e) forming contact holes at least in regions corresponding to the first apertures by etching the insulating layer using the resist layer as a mask; and (f) accumulating electrode material on the semiconductor wafer at least in a region corresponding to each contact hole, so that each ohmic electrode is formed.

With the above method, it is possible to stably form electrodes having desirable ohmic characteristics. The reason can be described as follows:

By producing not only the apertures for forming electrodes but also the dummy apertures in the resist layer, a total aperture area in the resist layer increases. As a result, an amount of gas which is emitted from the resist layer and adheres to regions of the semiconductor wafer surface corresponding to the apertures (contact holes) in the insulating layer decreases, thereby allowing electrodes with desirable ohmic characteristics to be stably formed.

In the step (f), usually a thin film forming method such as a vacuum deposition method, a sputtering method, or a chemical vapor phase epitaxy method is applied. It is considered that in the case where a large amount of plasma (ion, radical, or the like) generated during the application of such method is present around the apertures of the insulating layer, the gas emitted from the resist layer more likely adheres to the semiconductor.

Therefore, in the step (e), it is preferable that in addition to the contact holes, dummy holes should also be formed in regions corresponding to the dummy apertures of the resist layer. With this arrangement, plasma, or the like, is less concentrated around the apertures of the insulating layer (contact holes and dummy holes) in the step (f). As a result, the gas from the resist layer less likely adheres to the semiconductor, thereby allowing electrodes with desirable ohmic characteristics to be stably formed.

It is preferable that the apertures for forming electrodes (first apertures) and the dummy apertures (second apertures) account for not less than 0.5 percent of an area of the semiconductor wafer. With the present arrangement, a percent defective of electrodes formed on the semiconductor wafer remarkably decreases.

It is also preferable that the semiconductor wafer having the resist layer thereon is kept in a vacuum after the formation of the first and second apertures and before the accumulation of the electrode material. With this, emission of gas from the resist layer is promoted and electrodes with desirable ohmic characteristics are formed in a more stable manner.

For a fuller understanding of the nature and advantages of the invention, reference should be made to the ensuing detailed description taken in conjunction with the accompanying drawings.

BRIEF DESCRIPTION OF THE DRAWINGS

FIG. 4 is a graph illustrating the correlation between a period of time while a semiconductor wafer is kept in a vacuum since apertures are formed until electrode material is accumulated, and contact resistance.

DESCRIPTION OF THE PREFERRED EMBODIMENTS

The following description will discuss one embodiment of the present invention with reference to FIGS. 1(a) through 1(e), 3, and 4.

FIGS. 1(a) through 1(e) are process drawings illustrating a method of forming electrodes as an embodiment of the present invention.

In the present embodiment, the present invention is applied to formation of emitter electrodes 9 of a bipolar transistor formed on a III–V compound semiconductor wafer 1.

Figure 1A:
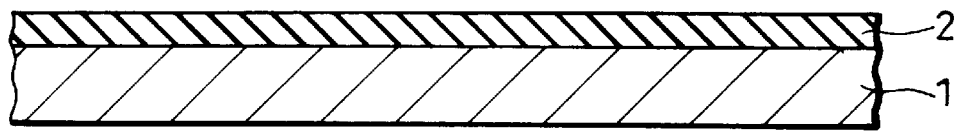
FIGS. 1(a) through 1(e) are process drawings illustrating a method of forming electrodes in accordance with one embodiment of the present invention.

First of all, as illustrated in FIG. 1(a), an insulating layer 2 is formed on the III–V compound semiconductor wafer 1. Note that used as the III–V compound semiconductor wafer 1 is, for example, a semiconductor wafer made of a GaAs compound having an InGaAs layer on the top.

Figure 1B:
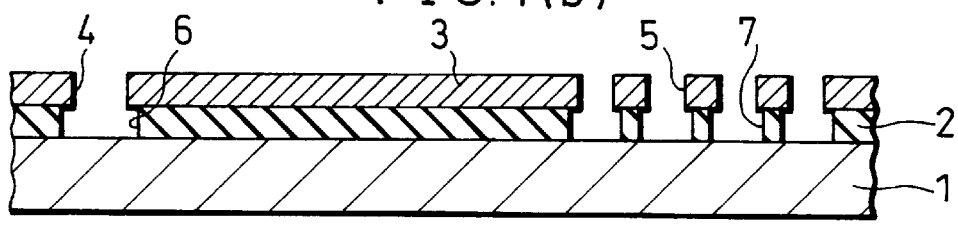

Next, as shown in FIG. 1(b), a resist layer 3 is formed on the insulating layer 2, by spreading a resist thereon. Applied for this purpose can be any of resists of well-known compositions, such one having novolak resin as solute and ethyl cellosolve acetate as solvent, one having cyclopentanone as solute and diethylene glycol monomethyl ether as solvent, or one having novolak resin as solute and 2-heptanone as solvent.

Thereafter, apertures 4 for electrode formation (hereinafter referred to as electrode formation apertures) are formed in regions in the resist layer 3 which correspond to regions where electrodes are formed (hereinafter referred to as electrode formation regions), by a photoetching method or the like. At substantially the same time of the formation of the electrode formation apertures 4, dummy apertures 5 are formed in regions of the resist layer 3 in a rest part other than the electrode formation regions, the regions making no contribution to electric conductivity (for example, a ground section). In this case, it is preferable that the dummy apertures 5 are formed so that a sum of areas of the electrode formation apertures 4 (areas of all the electrode formation apertures 4 formed with respect to the wafer 1) and areas of the dummy apertures 5 (areas of all the dummy apertures 5 formed with respect to the wafer 1) accounts for not less than 0.5 percent of an area of the wafer 1 (an area of a surface of the wafer 1 on the side where electrodes are formed).

Then, the insulating layer 2 is etched using the resist layer 3 as a mask, so as to form contact holes 6 and dummy holes 7. Each contact hole 6 is formed in a region corresponding to each electrode formation aperture 4. Each dummy hole 7 is formed in a region corresponding to each dummy aperture 5. This state is illustrated by FIG. 1(b).

The wafer 1 in this state is kept in a vacuum (degree of vacuum: $1\times10^{-5}$ Pa) for a predetermined period of time (for example, 60 minutes).

Figure 1C:
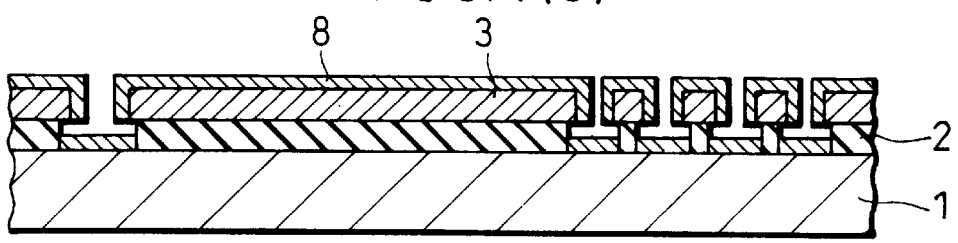

Next, as shown in FIG. 1(c), a metal nitride having a high melting point, or a metal silicide having a high melting point, is accumulated on the wafer 1 by a vacuum deposition method, a sputtering method, a chemical vapor phase epitaxy method, or the like. Thus, a conductor layer 8 made of such material having a high melting point is formed in regions of the wafer 1 corresponding to the contact holes 6 and the dummy holes 7, and on the resist layer 3. Used as such metal nitride having a high melting point is tungsten nitride (WN), molybdenum nitride (MoN), or titanium nitride (TiN) Used as such metal silicide having a high melting point is tungsten silicide (WSi), molybdenum silicide (MoSi), or titanium silicide (TiSi).

Figure 1D:
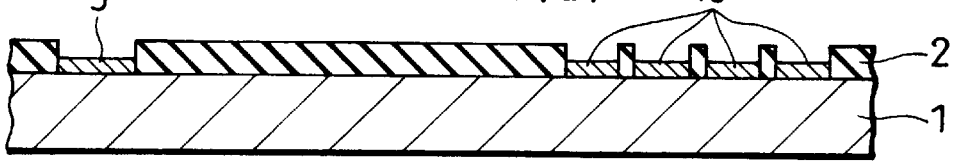

Thereafter, the resist layer 3 is removed using a resist releasing agent, as illustrated in FIG. 1(d). As a result the emitter electrodes 9 and dummy electrodes 10 are formed. Portions of the conductor layer 8 in the contact holes 6 constitute the emitter electrodes 9. Likewise, portions of the conductor layer 8 in the dummy holes 7 constitute the dummy electrodes 10.

Figure 1E:
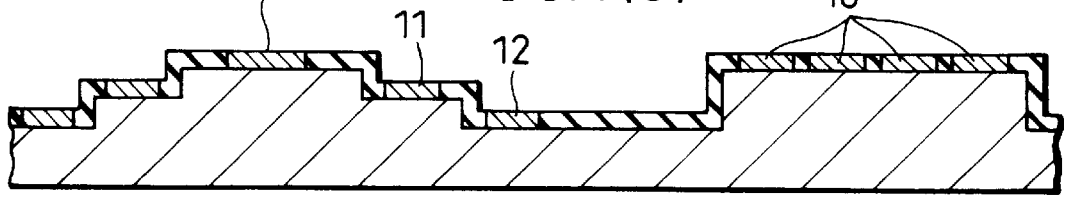
Figure 2A:
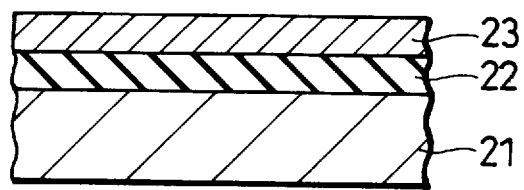
FIGS. 2(a) through 2(c) are process drawings illustrating a conventional method of forming electrodes.
Figure 2B:
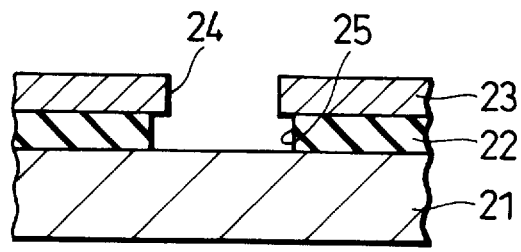
Figure 2C:
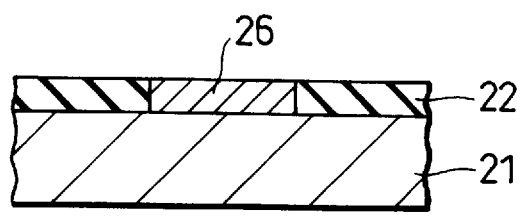

Finally, as shown in FIG. 1(e), base electrodes 11 and collector electrodes 12 are formed through a mesa-etching process and an electrode formation process. Through the above-described processes, the bipolar transistor is formed on the semiconductor wafer.

Though the process of keeping the wafer in a vacuum comes after the formation of the contact holes 6 and the dummy holes 7 according to the above description, the process may be carried out anytime after the formation of the electrode formation apertures 4 and the dummy apertures 5 and before the formation of the conductor layer 8. For example, the process of keeping the wafer in a vacuum may be carried out after the formation of the electrode formation apertures 4 and the dummy apertures 5 and before the formation of the contact holes 6 and the dummy holes 7.

Figure 3:
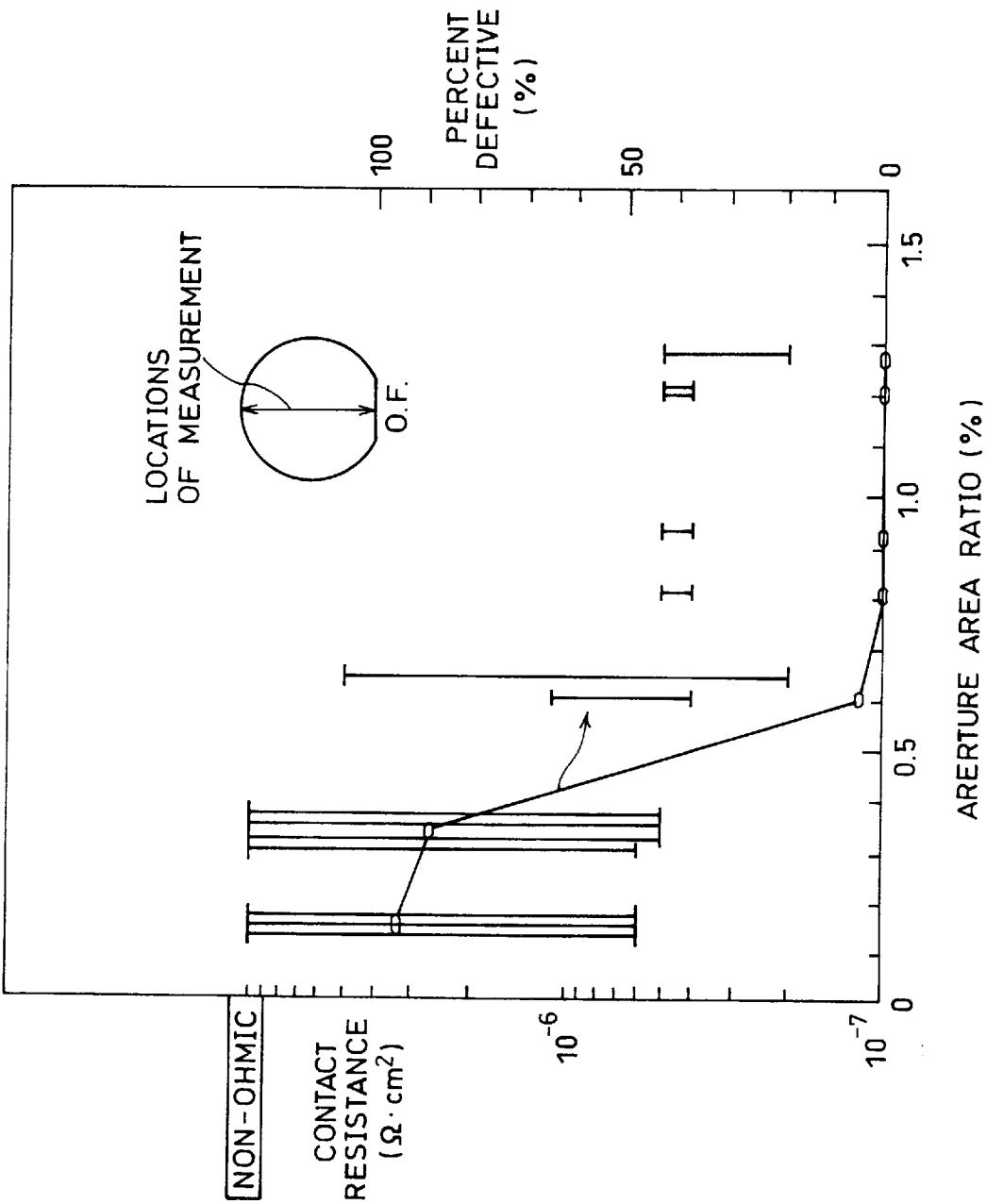
FIG. 3 is a graph illustrating the correlation between area ratio of apertures, contact resistance, and percent defective.

Electrodes for TLM (transmission line model) were formed on semiconductor wafers with respective different aperture area ratios, through the processes illustrated by FIGS. 1(a) through 1(e), and the correlation between the aperture area ratio, contact resistance, and percent defective were examined. The result is shown in FIG. 3. In this case, a period of time while the wafer was kept in a vacuum since the formation of the electrode formation apertures 4 and the dummy apertures 5 until the formation of the conductor layer 8 was 60 minutes. The aperture area ratio A (%) is given as:

$$A=\{(S_1+S_2)/S_3\}\times100$$

where, $S_1$ represents the total area of all the electrode formation apertures 4 formed with respect to the wafer, $S_2$ represents the total area of all the dummy apertures 5 formed with respect to the wafer, and $S_3$ represents the area of the wafer.

Each electrode for TLM had a length/width of 2/20 μm, and each interval between the electrodes was from 5 to 25 μm. The measurement was carried out at 50 locations shown in FIG. 3. To be more specific, 50 test elements to be measured were provided along a line passing through the center of the wafer, the line being vertical when the wafer was turned so that an orientation flat (O.F.) was directed downward. The percent defective indicates a ratio of electrodes which had contact resistance of not less than $1\times10^{-6}$ $\Omega.cm^2$.

Note that in order to carry out the measurement, 3 wafers, 4 wafers, 2 wafers, and 2 wafers were used in the cases where the aperture area ratios were about 0.15 percent, about 0.35 percent, about 0.6 percent, and about 1.2 percent, respectively. Under other conditions, one wafer was used per one aperture area ratio. In FIG. 3, a dispersion (range) of measured contact resistances of each wafer is indicated by each vertical line, while each percent defective (an average percent defective in the case where a plurality of wafers with a same aperture area ratio are used) is indicated by each voided circle.

As illustrated by FIG. 3 which shows the result of the measurement at the 50 locations on the wafer, the percent defective was 95 percent when the aperture area ratio was around 0.1 percent, and the percent defective was 90 percent when the aperture area ratio was around 0.3 percent. In contrast, a drastic change in the percent defective is seen around an aperture area ratio of 0.5 percent, and a stable and normal contact resistance was obtained when the aperture area ratio was not less than 0.5 percent. From this result, it is preferable that the aperture area ratio is not less than 0.5 percent. Note that a normal contact resistance is always obtained provided that the aperture area ratio is not less than 0.5 percent. In other words, there is no upper limit on a preferable range of the aperture area ratio.

Though a maximum contact resistance was as high as $5 \times 10^{-5}$ $\Omega.cm^2$ in the case where the aperture area ratio was around 0.6 percent, such measured results over $1 \times 10^{-6}$ $\Omega.cm^2$ were obtained at only several among the 50 locations, and the percent defective was only around 5 percent.

In the case where the aperture area ratio was not less than 0.8 percent, the percent defective was 0 percent. From this result, it is more preferable that the aperture area ratio is not less than 0.8 percent. Note that the percent defective was always very small (substantially 0 percent) provided that the aperture area ratio was not less than 0.8 percent. In other words, there is no upper limit on a more preferable range of the aperture area ratio.

In order to examine the correlation between the period of time for keeping the wafer in a vacuum and the contact resistance, electrode formation was carried out on semiconductor wafers through the processes shown in FIGS. 1(a) through 1(e), each operation having a period of a different length while one wafer was kept in a vacuum after the formation of the electrode formation apertures 4 and the dummy apertures 5 and before the formation of the conductor layer 8 (hereinafter this period is referred to as keeping-in-vacuum period). FIG. 4 illustrates the result of the measurement. For the measurement, the degree of vacuum was set to $1 \times 10^{-5}$ Pa, while the aperture area ratio was set to 0.5 percent.

Note that in order to show contact resistance distribution in the wafer, each wafer was divided into several regions, and respective measured results of the regions are shown in FIG. 4 with respective marks such as ○, △, and □.

As illustrated in FIG. 4, a relatively satisfactory contact resistance was obtained even in the case where the wafer was not kept in a vacuum (namely, the keeping-in-vacuum period was set to zero), but the contact resistance can be further decreased with an increase in the keeping-in-vacuum period. This is because gas contained in the resist is emitted while the wafer is kept in a vacuum. Especially in the case where the wafer was kept in a vacuum for not less than 60 minutes, it was possible to stably form ohmic electrodes with a contact resistance of not more than $1 \times 10^{-6}$ $\Omega.cm^2$ each. Therefore, it is preferable that the wafer is kept in a vacuum for not less than 60 minutes. Ohmic electrodes with a low contact resistance each can be always stably formed provided that the wafer is kept in a vacuum for not less than 60 minutes. In other words, there is no upper limit on a preferable range of the keeping-in-vacuum period.

Note that the degree of vacuum during the keeping-in-vacuum process is not restricted to $1 \times 10^{-5}$ Pa, and any degree of vacuum is applicable provided that it is not greater than $1 \times 10^{-4}$ Pa. Ohmic electrodes with a low contact resistance each can be always stably formed provided that the degree of vacuum is not greater than $1 \times 10^{-4}$ Pa. Namely, there is no lower limit to a preferable range of the degree of vacuum.

For the above-described embodiment, the present invention was applied to the formation of the emitter electrodes, but needless to say, the present invention can be applied likewise to the formation of the base electrodes or the collector electrodes of the bipolar transistor. The present invention is suitable not only to the formation of electrodes of the bipolar transistor but also to the formation of electrodes of other electric circuit devices, such as an MOS transistor. Furthermore, the application of the present invention is not restricted to the formation of electrodes on the III–V compound semiconductor wafer, but the present invention can be effectually applied to formation of electrodes on a IV compound semiconductor wafer such as that made of Si, or on a II–VI compound semiconductor wafer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming ohmic electrodes on a semiconductor wafer, comprising the steps of:
   (a) forming an insulating layer on the semiconductor wafer;
   (b) forming a resist layer on the insulating layer;
   (c) forming first apertures for forming the ohmic electrodes, each first aperture being formed in each first region of the resist layer corresponding to each region where each ohmic electrode is to be formed;
   (d) forming second apertures as dummy apertures in second regions of the resist layer in a rest part other than the first regions;
   (e) forming contact holes at least in regions corresponding to the first apertures by etching the insulating layer using the resist layer as a mask; and
   (f) accumulating electrode material on the semiconductor wafer at least in a region corresponding to each contact hole, so that each ohmic electrode is formed.

2. The method as set forth in claim 1, wherein a sum of areas of the first and second apertures accounts for not less than 0.5 percent of an area of the semiconductor wafer.

3. The method as set forth in claim 1, wherein a sum of areas of the first and second apertures accounts for not less than 0.8 percent of an area of the semiconductor wafer.

4. A method as set forth in claim 1, further comprising the step of keeping in a vacuum the semiconductor wafer having the resist layer formed thereon, after said steps (c) and (d) and before said step (f).

5. The method as set forth in claim 4, wherein the semiconductor wafer is kept in a vacuum for not less than 60 minutes.

6. The method as set forth in claim 4, wherein the semiconductor wafer is kept in a vacuum of not greater than $1 \times 10^{-4}$ Pa.

7. The method as set forth in claim 1, wherein:
   the semiconductor wafer is made of a III–V compound; and the electrode material is tungsten nitride.

8. The method as set forth in claim 1, wherein each ohmic electrode constitutes each electrode of a transistor.

9. The method as set forth in claim 1, wherein step (f) comprises the steps of:

accumulating the electrode material on the semiconductor wafer in the region corresponding to each contact hole, so that each ohmic electrode functioning as an electrode is formed; and accumulating the electrode material on the semiconductor wafer in a region corresponding to each dummy aperture, so that each dummy electrode not functioning as an electrode is formed.

10. A method of forming ohmic electrodes on a semiconductor wafer, the method comprising the steps of:

(a) forming an insulating layer on the semiconductor wafer;

(b) forming a resist layer on the insulating layer;

(c) forming first apertures for forming the ohmic electrodes, each first aperture being formed in each first region of the resist layer corresponding to each region where each ohmic electrode is to be formed;

(d) forming second apertures as dummy apertures in second regions of the resist layer in a rest part other than the first regions;

(e) forming contact holes and dummy holes in regions corresponding to the first and second apertures respectively, by etching the insulating layer using the resist layer as a mask; and (f) accumulating electrode material on the semiconductor wafer with the resist layer remaining; and (g) removing the resist layer, whereby each ohmic electrode is formed in the region corresponding to each contact hole on the semiconductor wafer.

11. The method as set forth in claim 10, wherein a sum of areas of the first and second apertures accounts for not less than 0.5 percent of an area of the semiconductor wafer.

* * * * *